United States Patent
Kim et al.

(10) Patent No.: US 7,525,148 B2
(45) Date of Patent: Apr. 28, 2009

(54) NONVOLATILE MEMORY DEVICE

(75) Inventors: Young-Joon Kim, Seoul (KR);
Dae-Woong Kim, Seoul (KR); Min Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 132 days.

(21) Appl. No.: 11/228,696

(22) Filed: Sep. 16, 2005

(65) Prior Publication Data

US 2006/0113610 A1 Jun. 1, 2006

(30) Foreign Application Priority Data

Nov. 26, 2004 (KR) ............... 10-2004-0097790

(51) Int. Cl.
*H01L 29/76* (2006.01)

(52) U.S. Cl. ................ 257/321; 257/374; 257/E29.304

(58) Field of Classification Search .............. 257/374, 257/506, 321, E29.304, 324; 438/296, 435
See application file for complete search history.

(56) References Cited

U.S. PATENT DOCUMENTS

| | | | |
|---|---|---|---|
| 5,719,085 A * | 2/1998 | Moon et al. | 438/424 |
| 6,013,551 A | 1/2000 | Chen et al. | |
| 6,037,018 A * | 3/2000 | Jang et al. | 427/579 |
| 6,146,970 A * | 11/2000 | Witek et al. | 438/424 |
| 6,740,955 B1 * | 5/2004 | Hong et al. | 257/506 |
| 6,787,409 B2 * | 9/2004 | Ji et al. | 438/221 |
| 2002/0158302 A1 * | 10/2002 | Kim | 257/510 |
| 2002/0197823 A1 * | 12/2002 | Yoo et al. | 438/424 |
| 2003/0104710 A1 * | 6/2003 | Visokay et al. | 438/798 |
| 2004/0072408 A1 * | 4/2004 | Yun et al. | 438/435 |
| 2004/0182815 A1 * | 9/2004 | Lee et al. | 216/13 |
| 2005/0167778 A1 * | 8/2005 | Kim et al. | 257/510 |
| 2005/0266647 A1 * | 12/2005 | Kim et al. | 438/296 |

* cited by examiner

*Primary Examiner*—Chandra Chaudhari
(74) *Attorney, Agent, or Firm*—Myers Bigel Sibley & Sajovec

(57) ABSTRACT

A nonvolatile memory device and a method of manufacturing the same are provided. An insulation layer having a high etching rate as compared with a pad oxide layer is formed as a buffer layer between a first STI film formed as a lower part of semiconductor substrate and a second STI film formed as an upper part of the semiconductor substrate, to obtain a pillar CD for an SAP structure. The buffer layer is etched more speedily in comparison with the pad oxide layer in a procedure of etching the pad oxide layer, thus ensuring a sufficient pillar CD without an excessive wet etch-back. Accordingly, a defect occurrence such as a grooving or seam can be prevented in realizing the SAP structure, and a tunnel oxide layer can be formed with uniform thickness.

23 Claims, 5 Drawing Sheets

NONVOLATILE MEMORY DEVICE

RELATED APPLICATION

This application claims the benefit of and priority to Korean Patent Application No. 2004-97790, filed Nov. 26, 2004, the disclosure of which is incorporated herein by reference as if set forth in its entirety.

FIELD OF THE INVENTION

The present invention relates to semiconductor devices, and more particularly, to nonvolatile memory devices and methods of manufacturing the same.

BACKGROUND OF THE INVENTION

Semiconductor memory devices that store data are generally divided into volatile memory devices and nonvolatile memory devices. In a semiconductor memory device, a volatile memory device such as a DRAM (Dynamic Random Access Memory) or SRAM (Static Random Access Memory) etc. has the characteristic that an input/output operation of data is speedy but stored data is lost by a cut-off of power. A nonvolatile memory device such as an EPROM (Erasable Programmable Read Only Memory) or EEPROM (Electrically Erasable Programmable Read Only Memory) etc. has the characteristic that an input/output operation of data is slow but stored data is maintained intact by a cut-off of power. Hence, such nonvolatile memory devices can be broadly used for memory cards for storing music or image data, or in a situation that power cannot be always supplied or a supply of power is intermittently stopped, like in a mobile phone system.

Meanwhile, particularly to overcome an integration limit of EEPROM in such nonvolatile memory devices, a demand for flash memory devices employing a 1 Tr/1 Cell structure of a batch erase system is increasing, in which data can be inputted/outputted freely electrically and which can be replaced in the future with a hard disk drive of a computer since power consumption is small and high-speed programming is valid. Such a flash memory device can be classified into a NOR type flash memory wherein two or more cell transistors are connected in parallel to a one bit line and a NAND type flash memory wherein two or more cell transistors are connected in series to a one bit line. However, in spite of the advantage that stored data is preserved even if power is cut off, such a flash memory device has a disadvantage in that operating speed is slow as compared with a volatile memory device. Thus, research for various cell structures and driving methods to increase programming and erasing speeds of flash memory devices are ongoing.

The NOR type flash memory device has a structure containing a plurality of memory cells. Each memory cell is constructed of a one bit line and a single transistor, and are connected in parallel. One memory cell transistor is connected between a drain connected to a bit line and a source connected to a common source line. The NOR type flash memory device can increase current of memory cells and can have a high speed operation. Unfortunately, high integration can be difficult because of the area occupied by a bit line contact and a source line.

Thus, in the field, a size of respective unit devices constituting a memory cell is scaled down by a trend of high integration and large capacity of a semiconductor device, and a high-integration technique to establish a multilayer structure within a limited area is also on a prosperous development, and this widely uses a laminated gate structure as one of the high-integration technique.

FIG. 1 illustrates a general laminated gate structure applied to a flash memory device.

Referring to FIG. 1, a shallow trench isolation film 12 through a general STI (Shallow Trench Isolation) process is formed on a semiconductor substrate 10 doped with P-type or N-type impurity. Then, on a channel region A of an active region defined by the STI film 12, a tunnel oxide layer 14, a floating gate 16 formed of polysilicon, a gate interlayer dielectric layer 18 constructed of an ONO (Oxide-Nitride-Oxide) layer, and a control gate 20 formed of polysilicon are formed sequentially, producing a gate region. Herewith, a tungsten silicon layer of Wsix etc. or tungsten (W) layer can be further formed on the control gate 20.

The floating gate is entirely electrically insulated from the outside under an isolated structure, and stores data by using change properties in current of a memory cell in conformity with an electron injection and electron emission to/from the floating gate. The electron injection to such floating gate employs a CHEI (Channel Hot Electron Injection) system using high-temperature electron in the channel, and the electron emission is performed through an F-N (Fowler-Nordheim) tunneling that is through use of the gate interlayer dielectric layer existing between the floating gate and the control gate. Voltage applied to the control gate is applied by a determined volume to the floating gate on the basis of a coupling ratio, and a variable deciding the coupling ratio is a capacitance of the tunnel oxide layer and a capacitance of the gate interlayer dielectric layer 18 formed of the ONO layer. In other words, an area of floating gate deciding a magnitude of the capacitance is important; an electric characteristic of flash memory device is prominent more, when thickness of a floating gate is thinner and an area of floating gate is wider.

However, in such a tendency that an integration of semiconductor device increases and a gate line width of an active region decreases, a distribution range of programming and erase voltage in a flash memory device becomes large by a distribution level through photolithography process and etching process to form a gate pattern. Furthermore, in case a thickness of floating gate becomes thicker to increase an overall area of the floating gate, there is a problem that a gap fill margin of STI film is reduced.

As a method to solve the problem an SAP (Self Aligned Poly) process is applied. But, in performing an excessive wet etch-back process in the procedure of removing a pad oxide layer in order to match with a subsequent pillar CD (Critical Dimension)(Reference Character A) in such an SAP structure, process time is lengthened and thickness of a tunnel oxide layer deposited within the pillar CD becomes different per region, which is disadvantageous in a cell distribution. Such a disadvantage is described as follows, referring to FIGS. 2A and 2B.

With reference to FIG. 2A, a pad oxide layer 102 and a nitride layer 104 are deposited sequentially on a semiconductor substrate 100 doped with P-type or N-type impurity. In a field region except an active region of the semiconductor substrate 100, an STI film 106 obtained through a general STI process is formed, wherein the STI film 106 is formed of a USG (Undoped Silicate Glass) film.

With reference to FIG. 2B, the nitride layer 104 (FIG. 2A) is etched by using, e.g., HF and phosphorus acid, in the semiconductor substrate on which the STI film 106 is formed. Then, the pad oxide layer 102 (FIG. 2A) is removed by using, e.g., HF, and next, a tunnel oxide layer 108 is deposited to form a laminated gate.

Herewith, in using the HF as etchant, the pad oxide layer 102 (FIG. 2A) is etched, and simultaneously, the USG film as the STI film 106 is etched. At this time, an excessive wet etch-back process on the STI film 106 is essential to ensure a pillar CD for the SAP structure. The pillar CD can be ensured for a desired size through an excessive etch-back process, but process time is lengthened by the excessive etching, and also a sinking effect (Reference Character B) is caused in a portion of the semiconductor substrate 100 contacted with the STI film 106, as illustrated. Also, a surface flatness of the active region is not uniform. As its result, on a center region of the pillar CD shown in reference character C and an edge region of the pillar CD shown in reference character D, deposition thickness of the tunnel oxide layer 108 becomes non-uniform. Unfortunately, when deposition thickness of the tunnel oxide layer is not uniform, a cell distribution is not good and the electrical characteristic of a memory device is degraded, thereby lowering reliability. Further, excessive wet etch-back to ensure the pillar CD delays processing, thus lowering productivity.

SUMMARY OF THE INVENTION

An exemplary embodiment of the invention provides a nonvolatile memory device and a method of manufacturing the same, which is capable of reducing wet etch-back time to ensure a pillar CD. A tunnel oxide layer can be deposited uniformly within an active region, and a pillar CD with a desired size can be ensured easily. Also cell distribution is satisfactory, and programming and erasing operations can be improved with enhanced reliability and productivity.

According to an embodiment of the invention, a nonvolatile memory device comprises a pair of semiconductor pillars, each pillar comprising: lower shallow trench isolation (STI) film formed in the interior of a semiconductor substrate; a buffer layer formed on the lower STI film comprising material having a high etching rate as compared with the lower STI film; an upper STI film formed on the buffer layer comprising a material having a low etching rate as compared with the buffer layer. The nonvolatile memory device also includes an active region between the pillars and comprising a flat surface with a tunnel oxide layer is deposited thereon.

According to another embodiment of the invention, a method of manufacturing a nonvolatile memory device comprises sequentially depositing a pad oxide layer and a nitride layer on a semiconductor substrate; forming a trench to form a shallow trench film, the trench having a given depth from the nitride layer to a predetermined position of the semiconductor substrate; entirely depositing a first insulation layer, and performing a wet etching process so that the first insulation layer can exist only within the trench region formed in the interior of the semiconductor substrate from the entire trench; depositing a buffer layer that has a rapid etching speed as compared with the pad oxide layer and the first insulation layer, for the same etchant, on the first insulation layer filled only within the trench region formed in the interior of the semiconductor substrate; depositing a second insulation layer that has a slow etching speed as compared with the buffer layer for the same etchant, on the semiconductor substrate on which the buffer layer was deposited, and then performing an etch-back to expose an upper surface of the nitride layer; and performing a wet etch-back to etch the pad oxide layer and the buffer layer after etching and removing the nitride layer, and so obtaining an active region on which a cell transistor will be formed.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Figure 1:
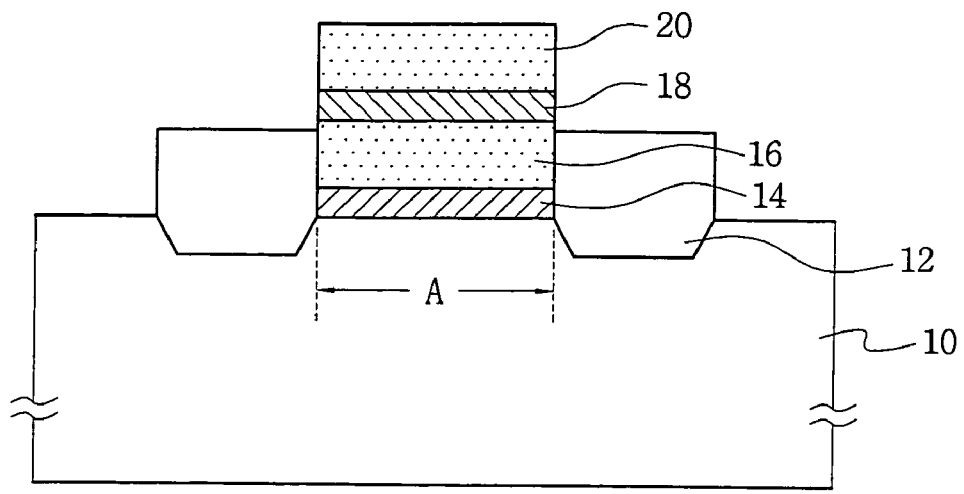
FIG. 1 illustrates a conventional laminated gate structure of a flash memory device.

Exemplary embodiments of the present invention are more fully described below with reference to FIGS. 3A to 3G. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Like numbers refer to like elements throughout. In the figures, the thickness of certain lines, layers, components, elements or features may be exaggerated for clarity. Broken lines illustrate optional features or operations unless specified otherwise. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y" As used herein, phrases such as "from about X to Y" mean "from about X to about Y"

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

FIGS. 3A to 3G sequentially illustrate manufacturing a flash memory device according to an exemplary embodiment of the invention.

Figure 3A:
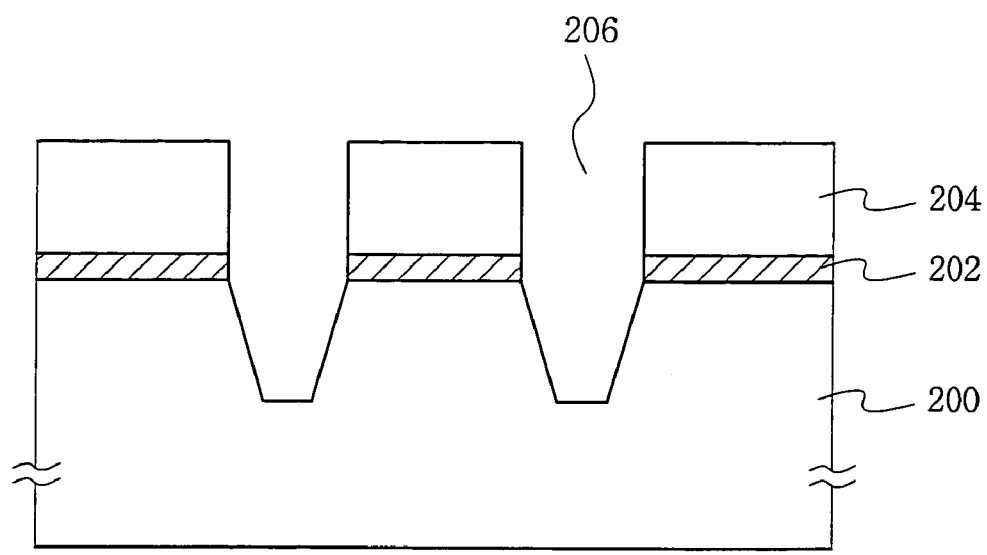
FIGS. 3A through 3G are sectional views illustrating a flash memory device according to an exemplary embodiment of the invention.

Referring first to FIG. 3A, a pad oxide layer 202 and a nitride layer 204 are sequentially deposited on a semiconductor substrate 200 doped with P-type or N-type impurity. The pad oxide layer 202 is deposited with a thickness of, e.g., about 110 Å, and the nitride layer 204 is deposited with thickness of, e.g., about 2000 Å.

Then, a photosensitive layer (not shown) is covered on the nitride layer 204, and a general photolithography process is performed to form a trench 206 to form an STI film.

Figure 3B:
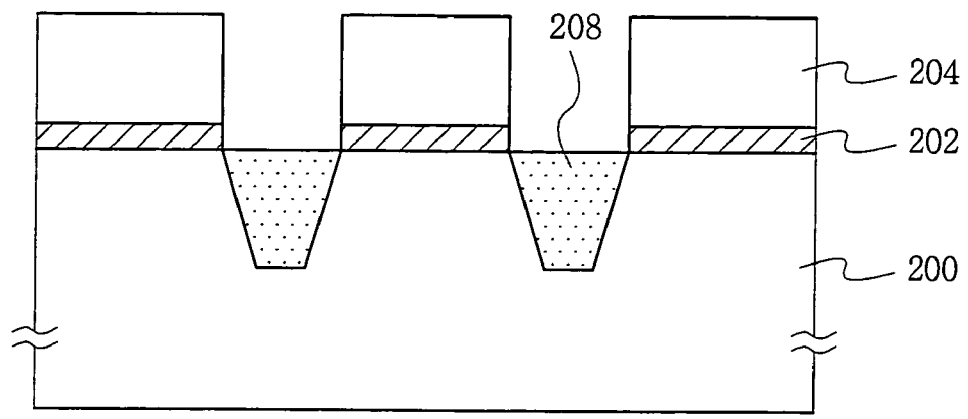

With reference to FIG. 3B, a first insulation layer is deposited with a thickness of about 2000 Å entirely on the semiconductor substrate 200 in which the trench 206 was formed, and next, a wet etching process is performed to form a first STI film 208 buried in the interior of the semiconductor substrate 200 as shown in FIG. 3B. Herewith, the first insulation layer may be an oxide layer formed of, e.g., HDP (High Density Plasma), and to form the first STI film 208, the first insulation layer is wet-etched for about 200~300 seconds under HF and for about 30~90 seconds under SC-1. More particularly, the first insulation layer is wet-etched for about 250 seconds under HF and for about one minute under SC-1.

Figure 3C:
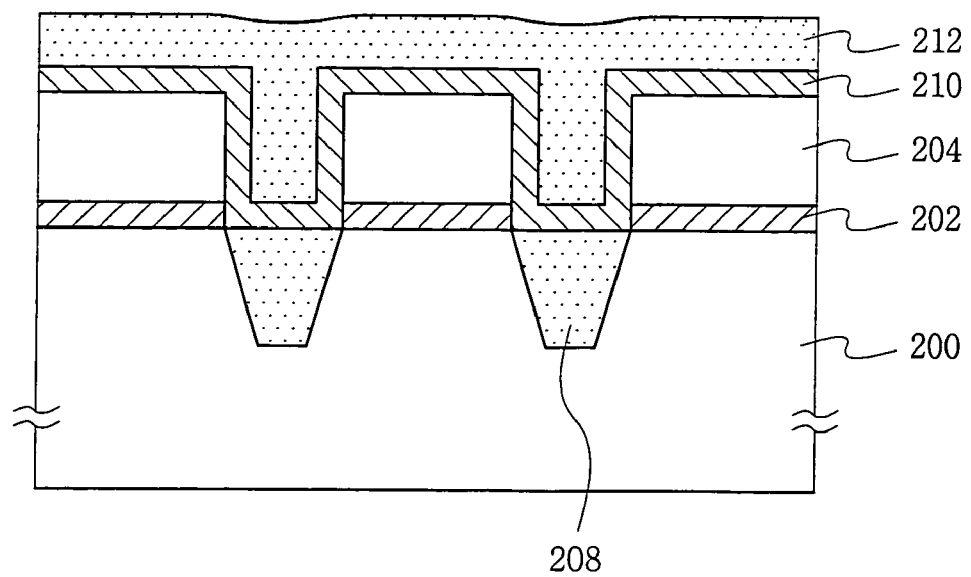

Referring to FIG. 3C, a material layer 210 having a high etching rate in comparison with an HDP oxide layer constituting the first STI film 208 is deposited on the semiconductor substrate 200 in which the first STI film 208 was formed. The material layer may be an MTO (Middle Temperature Oxide) layer.

The MTO layer 210 has a high etching rate as compared with the HDP oxide layer and the pad oxide layer 202, for etchant applied to etch the pad oxide layer 202. In other words, an excessive wet etch-back process was essential to ensure a pillar CD that operates as an important factor in a conventional SAP structure, however, according to an exemplary embodiment of the invention, the MTO layer 210 having a high etching rate as compared with the pad oxide layer 202 and the HDP oxide layer is formed as a buffer layer, thus reducing wet etch-back time with a sufficient pillar CD. The wet etch-back time is reduced, thereby solving a problem that a portion of the semiconductor substrate 200 is etched and sunk, and so thickness of a tunnel oxide layer deposited through a subsequent process becomes uniform. Such MTO layer 210 is formed to ensure a pillar CD having a desired width, thus a deposition thickness of the MTO layer 210 is controlled in conformity with a design rule of a cell transistor.

Meanwhile, a second insulation layer 212 is formed on the semiconductor substrate 200 on which the MTO layer 210 was formed, and is formed of an oxide layer of HDP equal to the first insulation layer. Herewith, the second insulation layer 212 is deposited with thickness enough to completely bury the trench 206, e.g., thickness of about 5000 Å.

Figure 3D:
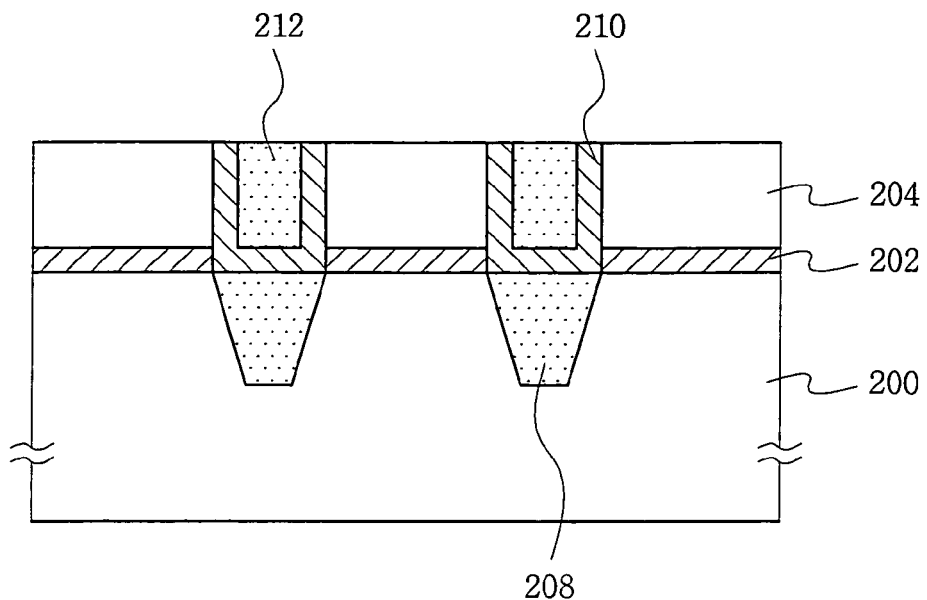

With reference to FIG. 3D, a planarization process such as dry etch-back or chemical mechanical polishing (CMP) is performed for the semiconductor substrate 200 on which the second insulation layer 212 was deposited, thus forming a second STI film 212 and simultaneously exposing an upper surface of the nitride layer 204.

Figure 3E:
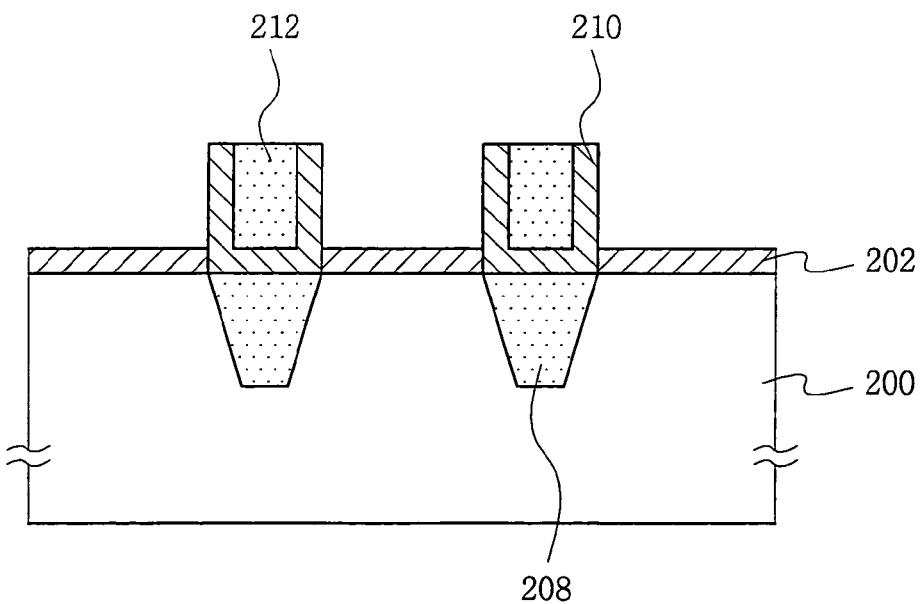

Referring to FIG. 3E, a wet etching process is executed for the semiconductor substrate 200 for which an upper surface of the nitride layer 204 (FIG. 3D) is exposed, thus removing the nitride layer 204. The wet-etching process for the nitride layer 204 is executed under HF for about 100 seconds, then is executed in-situ under phosphoric acid for about 60 minutes.

Figure 3F:
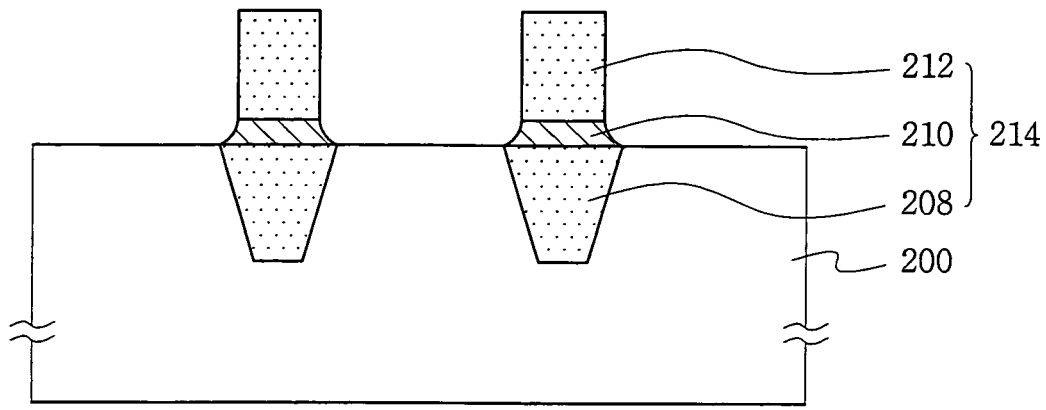
Figure 3G:
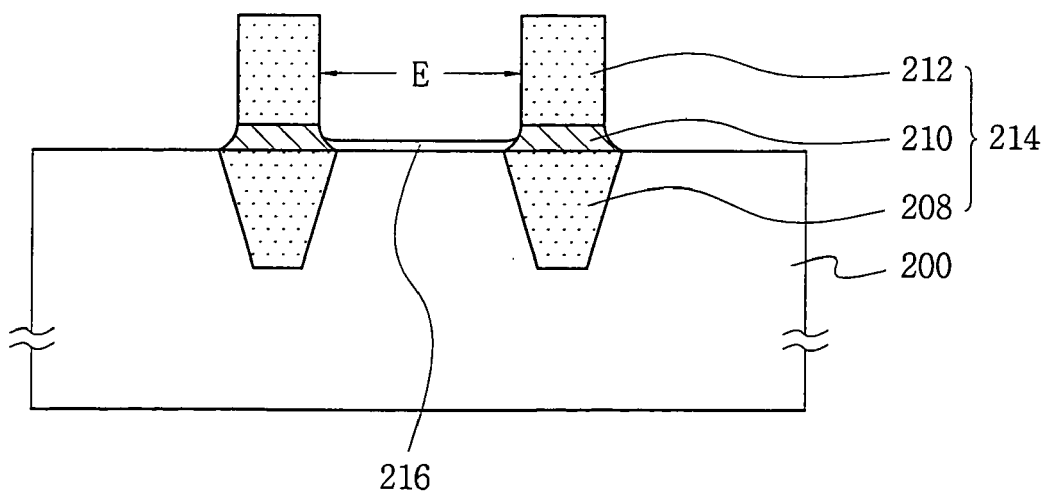

Referring to FIG. 3F, a wet etching process for the pad oxide layer 202 (FIG. 3E) is performed under HF for about 800 seconds. The pad oxide layer 202 and the MTO layer 210 are etched by the HF, thus ensuring the pillar CD for the SAP structure as shown in a reference character E (FIG. 3G). A pillar CD indicates an active region where a cell transistor is formed. On a field region of the semiconductor substrate 200, an STI film 214 is formed, which is constructed of first STI film 208, MTO layer 210 and second STI film 212.

Figure 2A:
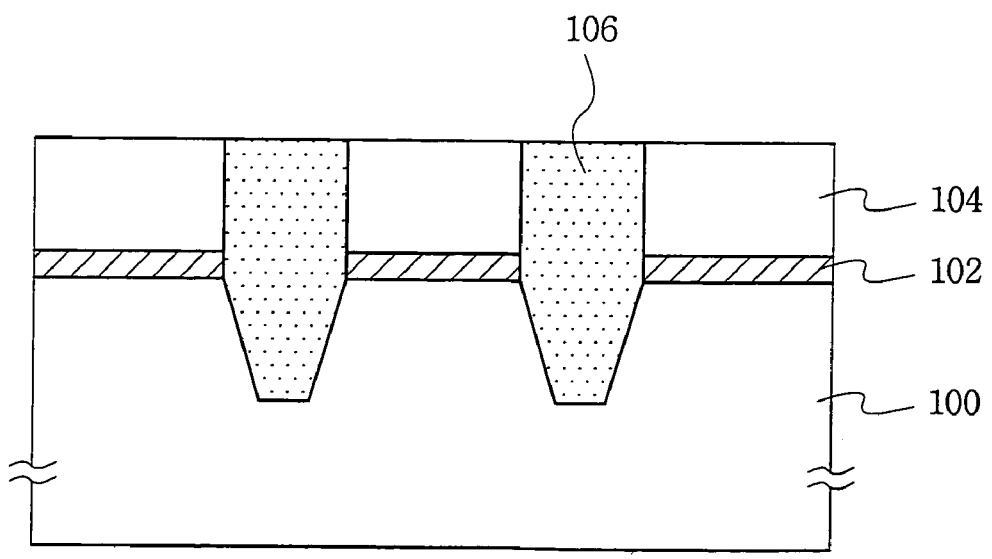
FIGS. 2A and 2B are sectional views of a conventional flash memory device.
Figure 2B:
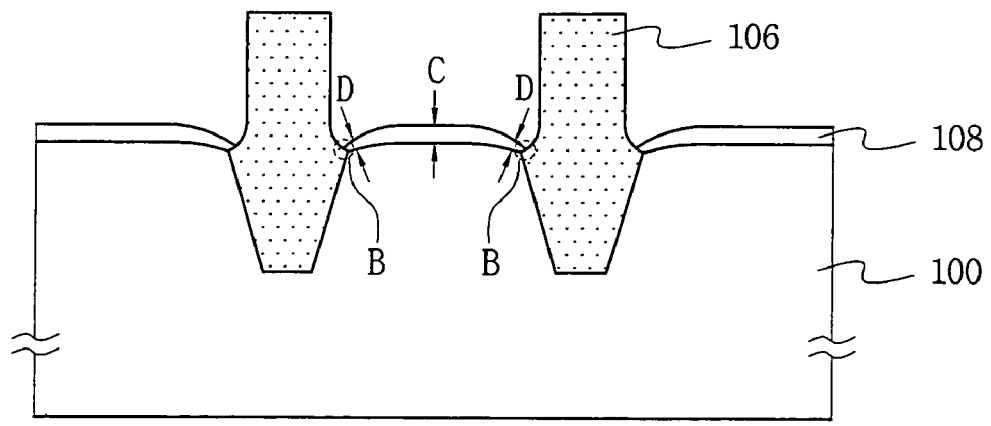

For the HF used as etchant, an etching rate of the MTO layer 210 is higher as compared with the pad oxide layer 202 or the HDP oxide layer as the first STI film 208 and the second STI film 212. Thus, the MTO layer 210 can be removed completely during etching the pad oxide layer 202, that is, the pillar CD of a desired size can be ensured even without a conventional excessive wet etch-back. Conventionally, an excessive wet etch-back was executed to ensure a pillar CD for an SAP structure, thus removing a material layer constituting the STI film, which causes a lengthened etching time and an erosion (Reference Character B of FIG. 2B) of the semiconductor substrate on a boundary portion between the STI film and the pad oxide layer owing to the excessive wet etch-back, thus, causing a problem because the thickness of a tunnel oxide layer deposited through a subsequent process becomes random by regions.

However, according to an exemplary embodiment of the invention, after forming the first STI film 208, and before forming the second STI film 212, an MTO layer 210 having a higher etching rate as compared with the pad oxide layer 202 and the HDP oxide layer is formed as a buffer layer, thereby sufficiently ensuring a pillar CD as shown in a reference character E (FIG. 3G) without an excessive wet etch-back to remove the pad oxide layer 202. Such reduced wet etch-back time can solve the erosion problem caused on the boundary portion of the STI film and the pad oxide layer, according to conventional processing, thus, improving a flat level of active region and providing a uniform thickness of tunnel oxide layer. In addition, generation of a defect such as a grooving or a seam can be prevented in a deposition of a conductive layer for the SAP process by sufficiently ensuring the pillar CD.

Referring to FIG. 3G, a tunnel oxide layer 216 is deposited on an active region as an E region defined by the STI film 214. According to an exemplary embodiment, the MTO layer 210 functioning as the buffer layer is formed between the first STI film 208 and the second STI film 212, whereby more shortening wet etch-back process time to ensure the pillar CD. An erosion of semiconductor substrate on a boundary portion of an STI film and a pad oxide layer is relieved, and so a tunnel oxide layer with a uniform deposition thickness for an entire active region can be formed, as shown in FIG. 3G A floating gate formed of a conductive layer such as a polysilicon layer etc., an ONO layer functioning as a gate interlayer dielectric layer, and a control gate formed of a conductive layer such as polysilicon etc., are further formed on the tunnel oxide layer 216, thus completing a laminated gate structure of a flash memory device. While, WSix or tungsten having a low resistance may be further formed on the control gate, and in forming the tungsten, Wsi and WN can be further formed as barrier metal.

As described above, an STI film defining an active region and a field region of a semiconductor substrate is formed, and then, after forming a first STI film formed as a lower part of the semiconductor substrate and before forming a second STI film formed as an upper part of the semiconductor substrate, an MTO layer is formed as a buffer layer, thereby shortening wet etch-back process time and ensuring a sufficient pillar CD, where the MTO layer has a high etching rate as compared with an insulation layer constructed of a pad oxide layer and the first and second STI films. Hence a tunnel oxide layer is deposited with uniform thickness, enhancing a cell distribution and the programming and erasing characteristics of a cell transistor and reliability of an overall semiconductor device. The wet etch-back process time is shortened, thus overall process time is reduced, with enhancement of productivity.

As described above, according to an exemplary embodiment of the invention, in an SAP process of a flash memory device, an insulation layer having a high etching rate as compared with a pad oxide layer is formed as a buffer layer between a first STI film formed as a lower part of semiconductor substrate and a second STI film formed as an upper part of the semiconductor substrate. Accordingly, the buffer layer is etched more speedily in a procedure of etching the pad oxide layer, thus ensuring a sufficient pillar CD without an excessive wet etch-back and so improving a thickness uniformity in a subsequent tunnel oxide layer deposition process, and also preventing a defect occurrence such as a grooving or seam in a filling process of a conductive layer to form a gate electrode. In addition, thickness of a tunnel oxide layer becomes uniform and a cell distribution becomes satisfactory, and a program and erase operating characteristic is improved with an enhanced reliability of an overall semiconductor device. Further, etching time for a pad oxide layer is reduced, thus shortening entire process time and increasing productivity.

While the present invention has been particularly shown and described with reference to exemplary embodiments thereof, it will be understood by those skilled in the art that various changes in form and details may be made therein without departing from the spirit and scope of the present invention as defined by the appended claims. Accordingly, these and other changes and modifications are seen to be within the true spirit and scope of the invention as defined by the appended claims.

What is claimed is:

1. A nonvolatile memory device for electrically programming and erasing data, comprising:
   a pair of pillars, each pillar comprising:
      a lower shallow trench isolation (STI) film formed in an interior of a semiconductor substrate;
      a buffer layer stacked on a top surface of the lower STI film, the buffer layer comprising a first material having a high etching rate as compared with the lower STI film;
      an upper STI film stacked on a top surface of the buffer layer, the upper STI film comprising a material having a low etching rate as compared with the buffer layer; and
   an active region between the pillars and comprising a flat surface with a tunnel oxide layer thereon;
   wherein the tunnel oxide layer comprises a second material that is different than the first material;
   wherein the buffer layer is a middle temperature oxide (MTO) layer.

2. A nonvolatile memory device for electrically programming and erasing data, comprising:
   a pair of pillars, each pillar comprising:
      a high density plasma (HDP) lower shallow trench isolation (STI) film formed in an interior of a semiconductor substrate, wherein the HDP lower STI film has a planar top surface that is at the same height as a top surface of the semiconductor substrate;
      a buffer layer stacked on a top surface of the lower STI film, the buffer layer comprising a first material having a high etching rate as compared with the lower STI film;
      an upper STI film stacked on a top surface of the buffer layer, the upper STI film comprising material having a low etching rate as compared with the buffer layer;
      an active region between the pillars and comprising a flat surface;
   a tunnel oxide layer of uniform thickness formed on the active region flat surface, wherein the tunnel oxide layer comprises a second material that is different than the first material;
   a floating gate formed on the tunnel oxide layer;
   a gate interlayer dielectric layer formed on the floating gate; and
   a control gate formed on the gate interlayer dielectric layer,
   wherein a maximum width of an upper surface of the buffer layer that is adjacent the upper STI film is less than a maximum width of a lower surface of the buffer layer that is adjacent to the HDP lower STI film.

3. The device of claim 2, wherein the buffer layer comprises an MTO (Middle Temperature Oxide) layer.

4. The device of claim 3, wherein the upper STI film is an oxide film that comprises HDP.

5. The device of claim 4, wherein the gate interlayer dielectric layer comprises an ONO (Oxide-Nitride-Oxide) layer.

6. A nonvolatile memory device for electrically programming and erasing data, comprising:
   a pair of pillars, each pillar comprising a high density plasma (HDP) a lower shallow trench isolation (STI) film, a buffer layer and an HDP upper STI film sequentially stacked on top of one another, wherein the HDP lower STI film is formed in an interior of a semiconductor substrate such that a top surface of the HDP lower STI film is at the same height as a top surface of the semiconductor substrate, wherein the buffer layer is formed on a top surface of the HDP lower STI film and comprises a material having a high etching rate as compared with the HDP lower STI film, and wherein the HDP lower STI film is formed on a top surface of the buffer layer and comprises a material having a low etching rate as compared with the buffer layer;

an active region between the pillars and comprising a flat surface;

a tunnel oxide layer of uniform thickness formed on the active region flat surface, wherein a bottom surface of the tunnel oxide layer is directly on the semiconductor substrate, a first side surface of the tunnel oxide layer is on a side surface of the buffer layer of the first of the pair of pillars, and a second side surface of the tunnel oxide layer is on a side surface of the buffer layer of the second of the pair of pillars;

a floating gate formed on the tunnel oxide layer;

a gate interlayer dielectric layer formed on the floating gate; and a control gate formed on the gate interlayer dielectric layer, wherein a maximum width of the HDP lower STI film exceeds a maximum width of the HDP upper STI film, and wherein the buffer layer is thicker than the tunnel oxide layer.

7. The device of claim 6, wherein the buffer layer comprises a Middle Temperature Oxide (MTO) layer.

8. The device of claim 7, wherein the gate interlayer dielectric layer comprises an ONO (Oxide-Nitride-Oxide) layer.

9. The device of claim 1, wherein the lower STI film has a continuous and planar top surface that is at the same height as a top surface of the semiconductor substrate.

10. The device of claim 9, wherein the tunnel oxide layer is in direct contact with at least one of the pillars of the pair of pillars, and wherein a bottom surface of the tunnel oxide layer is directly on the semiconductor substrate, a first side surface of the tunnel oxide layer is on a side surface of the buffer layer of the first of the pair of pillars, and a second side surface of the tunnel oxide layer is on a side surface of the buffer layer of the second of the pair of pillars.

11. The device of claim 10, wherein the lower STI film and the upper STI film are oxide films that comprise high density plasma (HDP), and wherein a maximum width of the HDP lower STI film exceeds a maximum width of the HDP upper STI film.

12. The device of claim 5, wherein a bottom surface of the tunnel oxide layer is directly on the semiconductor substrate, a first side surface of the tunnel oxide layer is on a side surface of the buffer layer of the first of the pair of pillars, and a second side surface of the tunnel oxide layer is on a side surface of the buffer layer of the second of the pair of pillars.

13. The device of claim 8, wherein the tunnel oxide layer comprises a second material that is different than the first material.

14. An intermediate structure that is formed during fabrication of a nonvolatile memory device, comprising:

a semiconductor substrate;

a pair of pillars, each pillar comprising:
 a lower shallow trench isolation (STI) film formed in an interior of the semiconductor substrate;
 an upper STI film on the lower STI film buffer layer;
 a buffer layer having a planar lower surface between the lower STI film and the upper STI film, the buffer layer further including sidewalls extending from the planar lower surface that are on respective sidewalls of the upper STI film;

an active region between the pillars and comprising a flat surface; and a tunnel oxide layer of uniform thickness formed on the active region flat surface, wherein a maximum width of an upper surface of the tunnel oxide layer exceeds a maximum width of a lower surface of the tunnel oxide layer, and wherein the buffer layer is thicker than the tunnel oxide layer.

15. The intermediate structure of claim 14, wherein the upper STI film comprises a high density plasma (HDP) upper STI film, wherein the lower STI film comprises an HDP lower upper STI film, and wherein the buffer layer comprises a Middle Temperature Oxide (MTO) layer.

16. The intermediate structure of claim 15, wherein a maximum width of the HDP lower STI film exceeds a maximum width of the HDP upper STI film.

17. The device of claim 1, wherein a maximum width of an upper surface of the buffer layer that is adjacent the upper STI film is less than a maximum width of a lower surface of the buffer layer that is adjacent the lower STI film.

18. The device of claim 17, wherein a maximum width of an upper surface of the tunnel oxide layer exceeds a maximum width of a lower surface of the tunnel oxide layer.

19. The device of claim 18, wherein the buffer layer is thicker than the tunnel oxide layer.

20. The device of claim 13, wherein a maximum width of an upper surface of the tunnel oxide layer exceeds a maximum width of a lower surface of the tunnel oxide layer.

21. The device of claim 20, wherein the buffer layer is thicker than the tunnel oxide layer.

22. The device of claim 6, wherein a maximum width of an upper surface of the buffer layer that is adjacent the HDP upper STI film is less than a maximum width of a lower surface of the buffer layer that is adjacent the HDP lower STI film.

23. The device of claim 22, wherein a maximum width of an upper surface of the tunnel oxide layer exceeds a maximum width of a lower surface of the tunnel oxide layer.

* * * * *